United States Patent
Hsu

(10) Patent No.: US 9,075,305 B2
(45) Date of Patent: Jul. 7, 2015

(54) PHOTOSENSITIVE RESIN COMPOSITION FOR COLOR FILTERS AND USES THEREOF

(71) Applicant: CHI MEI CORPORATION, Tainan (TW)

(72) Inventor: Jung-Pin Hsu, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/021,684

(22) Filed: Sep. 9, 2013

(65) Prior Publication Data

US 2014/0091267 A1    Apr. 3, 2014

(30) Foreign Application Priority Data

Sep. 28, 2012  (TW) .............................. 101135705 A

(51) Int. Cl.
 *G02B 5/23*  (2006.01)
 *G03F 7/033*  (2006.01)
 *G02B 5/22*  (2006.01)
 *G03C 1/00*  (2006.01)
 *G03F 7/00*  (2006.01)

(52) U.S. Cl.
 CPC .............. *G03F 7/033* (2013.01); *G03F 7/0007* (2013.01)

(58) Field of Classification Search
 USPC ....... 252/586; 349/106, 123; 359/891; 430/7, 430/281.1, 285.1, 286.1; 522/6; 526/271; 548/403; 428/447
 See application file for complete search history.

(56) References Cited

U.S. PATENT DOCUMENTS

2010/0163811 A1 * 7/2010 Oh et al. ........................ 252/586
2011/0228201 A1 * 9/2011 Hsu et al. ....................... 349/106

FOREIGN PATENT DOCUMENTS

| JP | 6-95211 | | 11/1994 | |
|---|---|---|---|---|
| JP | 8-183819 | | 7/1996 | |
| JP | 2001-75273 | | 3/2001 | |
| JP | 2001-220414 | * | 8/2001 | ............ C08F 222/40 |
| JP | 2011-128589 | * | 6/2011 | ............ G03F 7/038 |

* cited by examiner

*Primary Examiner* — Bijan Ahvazi

(74) *Attorney, Agent, or Firm* — WPAT, P.C.; Anthony King; Kay Yang

(57) ABSTRACT

The invention relates to a photosensitive resin composition, and a color filter produced thereby has the advantages of no bubble display and little color difference before and after development. The invention also provides a method for manufacturing a color filter, color filter and liquid crystal display device.

11 Claims, No Drawings

PHOTOSENSITIVE RESIN COMPOSITION FOR COLOR FILTERS AND USES THEREOF

BACKGROUND OF THE INVENTION

1. Field of the Invention

The invention relates to a photosensitive resin composition for a color filter in a liquid crystal display device; particularly to a photosensitive resin composition for a color filter having the advantages of no bubble display and little color difference before and after development.

2. Description of the Related Art

Presently, color filters are widely applied in the field of office equipment such as color liquid crystal displays, color facsimile machines, color cameras. With the growing market demand, the fabrication technology of color filters is diversified. Currently, the dyeing method, the printing method, the electroplating method, the dispersion method and other manufacturing methods are developed, among which the dispersion method is the mainstream process.

The process of the dispersion method includes: first, dispersing a coloring pigment in a photosensitive resin; next, coating the photosensitive resin on a glass substrate, and then subjecting the glass substrate to exposure and development, to fabricate a specific pattern. After repeating the operation three times, a red (R), green (G) and blue (B) pixel colored layer pattern, and then a protection film can be optionally applied on the pixel colored layer pattern.

The photosensitive resin useful in the process of the dispersion method may be those disclosed in Japanese Patent Application Publication No. 1994-95211 and Japanese Patent Application Publication No. 1996-183819, for example, copolymers obtained through polymerization with (meth) acrylic acid as monomer, which is an alkali-soluble resin of the photosensitive resins.

However, in the manufacturing process of color filters, multiple heat treatment steps are required, for example, a post-bake step and a step of forming a transparent conductive film (ITO film) after formation of the red (R), green (G) and blue (B) pixel colored layer pattern, and the steps are generally performed at a high temperature of 200° C. or more, but if the conventional photosensitive resin is heated for about 1 hr at 180° C., generation of aggregated pigment particles (the particle diameter of common aggregated pigment particles is in the range of 1 to 10 μm) in the pixel colored layer easily occurs; and moreover, the heat resistance of the pixel colored layer is poor.

In order to solve the problem, a photosensitive resin composition disclosed in Japanese Patent Application Publication No. 2001-075273 includes a polymer obtained through polymerization of an unsaturated monomer containing a carboxyl group and a monomer containing a glycidyl group as an alkali-soluble resin of a photosensitive resin. However, a color filter fabricated with the photosensitive resin composition in the prior art has the defect of bubble display and the problem of large color difference after development.

Therefore, how to overcome the defect of bubble display and the problem of large color difference after development to meet the current requirements in the industry is objective to study in the technical field of the present invention.

SUMMARY OF THE INVENTION

In the present invention, a specific alkali-soluble resin and a compound having an ethylenically unsaturated group are provided to obtain a photosensitive resin composition for a color filter having the advantages of no bubble display and little color difference before and after development.

Therefore, the invention relates to a photosensitive resin composition comprising:
an alkali-soluble resin (A) comprising a first alkali-soluble resin (A-1) polymerized by a monomer mixture, and the monomer mixture comprising a first unsaturated monomer containing a carboxylic acid group and a second unsaturated monomer containing an alicyclic group;
a compound having an ethylenically unsaturated group (B) comprising a cyclic imide compound (B-1) represented by Formula (1);

Formula (1)

wherein in Formula (1), $R^1$ and $R^2$ are independently selected from the group consisting of a hydrogen atom and an alkyl group having 1 to 10 carbon atoms; or $R^1$ and $R^2$ together form a carbon ring;
a photoinitiator (C);
an organic solvent (D); and
a pigment (E).

The present invention also provides a method for manufacturing a color filter comprising applying the photosensitive resin composition as mentioned above to form a pixel layer.

The present invention also provides a color filter manufactured by the method as mentioned above.

The present invention further provides a liquid crystal display component comprising the color filter as mentioned above.

DETAILED DESCRIPTION OF THE INVENTION

The invention relates to a photosensitive resin composition comprising:
an alkali-soluble resin (A) comprising a first alkali-soluble resin (A-1) polymerized by a monomer mixture, and the monomer mixture comprising a first unsaturated monomer containing a carboxylic acid group and a second unsaturated monomer containing an alicyclic group;
a compound having an ethylenically unsaturated group (B) comprising a cyclic imide compound (B-1) represented by Formula (1);

Formula (1)

wherein in Formula (1), $R^1$ and $R^2$ are independently selected from the group consisting of a hydrogen atom and an alkyl group having 1 to 10 carbon atoms; or $R^1$ and $R^2$ together form a carbon ring;
a photoinitiator (C);
an organic solvent (D); and
a pigment (E).

The alkali-soluble resin (A) according to the invention comprises a first alkali-soluble resin (A-1) polymerized by a monomer mixture, and the monomer mixture comprising a first unsaturated monomer containing a carboxylic acid group and a second unsaturated monomer containing an alicyclic group.

The structure of the first unsaturated monomer containing a carboxylic acid group is not specifically limited. In one embodiment of the invention, the first unsaturated monomer is acrylic acid (AA), methacrylic acid (MAA), 2-methacryloyloxyethyl succinate monoester (HOMS), crotonic acid, α-chloro-acrylic acid, ethyl acrylic acid, cinnamic acid, maleic acid, maleic anhydride, fumaric acid, itaconic acid, itaconic anhydride, citraconic acid, citraconic anhydride or the mixture thereof; preferably, the first unsaturated monomer is acrylic acid, methacrylic acid, 2-methacryloyloxyethyl succinate monoester or the mixture thereof.

In one embodiment of the invention, the amount of the first unsaturated monomer used is from 20 to 50 parts by weight; preferably from 22 to 45 parts by weight; more preferably from 25 to 40 parts by weight; based on 100 parts by weight of the monomer mixture used. The range makes the photosensitive resin composition has the better developability during the lithography procedure such as exposure, development, etc.

The structure of the a second unsaturated monomer containing an alicyclic group is not specifically limited. In one embodiment of the invention, the second unsaturated monomer is selected from the group consisting of an unsaturated compound containing a bicyclopentyl group, an unsaturated compound containing a bicyclopentadienyl group and the mixtures thereof.

In one embodiment of the invention, the unsaturated compound containing a bicyclopentyl group is represented by Formula (2),

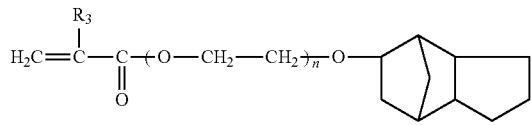

Formula (2)

wherein,
$R^3$ is a hydrogen atom or a methyl group; and
n is an integer of 0 to 2.

In another aspect, in one embodiment of the invention, the unsaturated compound containing a bicyclopentadienyl group is represented by Formula (3),

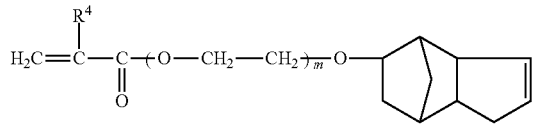

Formula (3)

wherein,
$R^4$ is a hydrogen atom or a methyl group; and
m is an integer of 0 to 2.

In one preferred embodiment of the invention, the second unsaturated monomer is selected from the group consisting of bicyclopentyl(meth)acrylate, bicyclopentenyl(meth)acrylate, bicyclopentyloxyethyl(meth)acrylate, bicyclopentenyloxyethyl(meth)acrylate, and the mixture thereof.

If the second unsaturated monomer containing an alicyclic group lacks, it has the defect of bubble display. In one embodiment of the invention, the amount of the second unsaturated monomer used is from 10 to 50 parts by weight; preferably from 12 to 45 parts by weight; more preferably from 15 to 40 parts by weight. The range makes the pixel layer formed by the photosensitive resin composition has excellent resistance to sputtering resistance and no bubble display.

In a preferred embodiment of the present invention, the monomer mixture further includes a third unsaturated monomer. Specific examples of the third unsaturated monomer are styrene, α-methylstyrene, vinyl toluene, p-chlorostyrene, divinyl benzene, phenylmethyl methacrylate, phenyl methacrylate, phenyl methacrylate, phenyl acrylate, 2-nitrophenyl acrylate, 4-nitrophenyl acrylate, 2-nitrophenyl methacrylate, 2-nitrolphenylmethyl methacrylate, 2-nitrophenyl methacrylate, 2-chlorophenyl methacrylate, 4-chlorophenyl methacrylate, 2-chlorophenyl acrylate, 4-chlorophenyl acrylate, phenoxyethyl methacrylate, phenoxypolyglycol acrylate, phenoxypolyglycol methacrylate, nonylphenoxypolyglycol acrylate, nonylphenoxypolyglycol acrylate, N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, o-vinylphenol, m-vinylphenol, p-vinylphenol, 2-methyl-4-vinylphenol, 3-methyl-4-vinylphenol, o-isopropenylphenol, m-isopropenylphenol, p-isopropenylphenol, 2-vinyl-1-naphthol, 3-vinyl-1-naphthol, 1-vinyl-2-naphthol, 3-vinyl-2-naphthol, 2-isopropenyl-1-naphthol, 3-isopropenyl-1-naphthol, o-methoxystyrene, m-methoxystyrene, p-methoxystyrene, o-methoxymethylstyrene, m-methoxymethylstyrene, p-methoxymethylstyrene, o-(vinylphenylmethyl)glycidyl ether, m-(vinylphenylmethyl)glycidyl ether, p-(vinylphenylmethyl)glycidyl ether, indene, acetylnaphthalene, N-cyclohexylmaleimide, methyl acrylate (MA), ethyl acrylate, n-propyl acrylate, isopropyl acrylate, n-butyl acrylate, isobutyl acrylate, sec-butyl acrylate, tert-butyl acrylate, 2-hydroxyethyl acrylate, 2-hydroxypropyl acrylate, 3-hydroxypropyl acrylate, 2-hydroxybutyl acrylate, 3-hydroxybutyl acrylate, 4-hydroxybutyl acrylate, allyl acrylate, triethylene glycol methoxy acrylate, ethyl N,N-dimethylaminoacrylate, propyl N,N-diethylaminoacrylate, propyl N,N-dibutylaminoacrylate, glycidyl acrylate, methyl methacrylate (MMA), ethyl methacrylate, n-propyl methacrylate, isopropyl methacrylate, n-butyl methacrylate, isobutyl methacrylate, sec-butyl methacrylate, tert-butyl methacrylate, 2-hydroxyethyl methacrylate, 2-hydroxypropyl methacrylate, 3-hydroxypropyl methacrylate, 2-hydroxybutyl methacrylate, 3-hydroxybutyl methacrylate, 4-hydroxybutyl methacrylate, allyl methacrylate, triethylene glycol methoxy methacrylate, dodecyl methacrylate, myristyl methacrylate, cetyl methacrylate, octadecyl methacrylate, eicosyl methacrylate, docosyl methacrylate, N,N-dimethylaminoethyl methacrylate, propyl N,N-dimethylaminomethacrylate, ethyl N-isobutylaminomethylacrylate, glycidyl methacrylate (GMA), vinyl acetate, vinyl propionate, vinyl butyrate, vinyl methyl ether, vinyl ethyl ether, allyl glycidyl ether, methallyl glycidyl ether, acrylonitrile, methacrylonitrile, α-chloroacrylonitrile, vinylidene cyanide, acrylamide, methacrylamide, α-chloroacrylamide, N-hydroxyethylacrylamide, N-hydroxyethylmethacrylamide, 1,3-butadiene, isopentene, butadiene chloride or a mixture thereof; and preferably, the third unsaturated monomer is MA, ethyl acrylate, n-propyl acrylate, isopropyl acrylate, n-butyl acrylate, isobutyl acrylate, sec-butyl acrylate, tert-butyl acrylate, 2-hydroxyethyl acrylate, 2-hydroxypropyl acrylate, MMA, ethyl methacrylate, n-propyl methacrylate, isopropyl methacrylate, n-butyl methacrylate, isobutyl methacrylate, sec-butyl methacrylate, tert-butyl methacrylate, 2-hydroxyethyl methacrylate, 2-hydroxypropyl methacrylate, GMA, vinyl acetate, acrylonitrile, methacrylonitrile, 1,3-butadiene, isopentene or the mixture thereof. Preferably, the third unsaturated monomer is styrene, α-methstyrene, phenylmethacrylate, phenylacrylate, N-phenylmaleimide (PMI), N-o-hydroxyphenylmaleimide, N-m-hydroxyphenylmaleimide, N-p-hydroxyphenylmaleimide, glycidyl methacrylate, methyl methacrylate monomer, methyl acrylate monomer, or the mixture thereof.

In one embodiment of the invention, the amount of the third unsaturated monomer used is from 0 to 70 parts by weight; preferably from 0 to 60 parts by weight; more preferably from 0 to 50 parts by weight. The range makes the photosensitive resin composition has advantage of few residues.

In one embodiment of the invention, the amount of the first alkali-soluble resin (A-1) used is from 30 to 100 parts by weight; preferably from 35 to 95 parts by weight; more preferably from 40 to 90 parts by weight based on 100 parts by weight of the alkali-soluble resin (A) used. The range makes the liquid crystal display device has no bubble display.

In one preferred embodiment of the invention, the alkali-soluble resin (A) further comprises a second alkali-soluble resin (A-2). In one embodiment of the invention, the second alkali-soluble resin (A-2) comprises a derived unit represented by Formula (4),

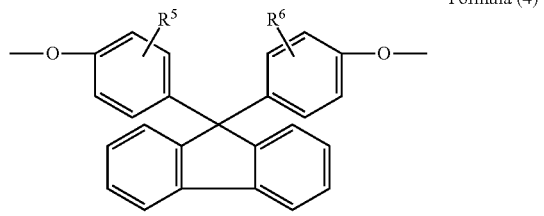

Formula (4)

wherein in Formula (4), $R^5$ and $R^6$ are independently selected from the group consisting of a hydrogen atom and a linear or branched alkyl group having 1 to 5 carbon atoms, a phenyl group and a halogen atom.

The second alkali-soluble resin (A-2) is obtained by reacting the compound represented by Formula (4) and other copolymerizable compounds.

In one embodiment of the invention, the compound represented by Formula (4) is a bisphenol fluorine type compound containing an epoxy group represented by Formula (5) or a bisphenol fluorine type compound containing an hydroxy group represented by Formula (6).

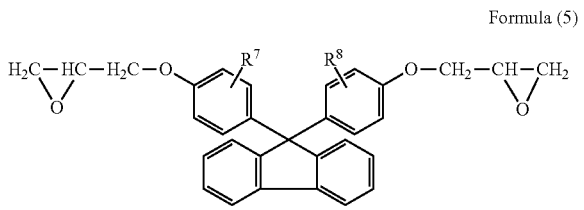

Formula (5)

In Formula (5), $R^7$ is the same to $R^5$ in Formula (4); $R^8$ is the same to $R^6$ in Formula (4).

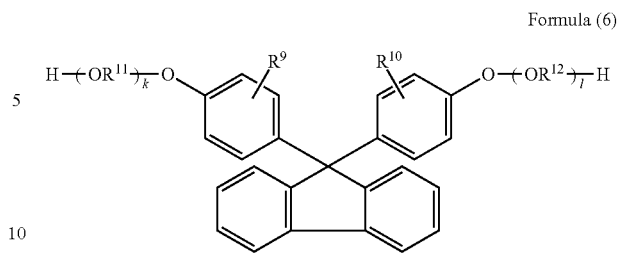

Formula (6)

In Formula (6), $R^9$ is the same to $R^5$ in Formula (4); $R^{10}$ is the same to $R^6$ in Formula (4);

$R^{11}$ and $R^{12}$ are independently an alkylene group or an aliphatic cyclene having 1 to 20 carbon atoms; and k and l are independently an integer of 1 to 4.

Specific examples of other copolymerizable compounds are: unsaturated monocarboxylic acid such as acrylic acid, methacrylic acid, butenoic acid, α-chloroacrylic acid, ethylacrylic acid, or cinnamic acid; dicarboxylic acid and anhydride thereof such as maleic acid, itaconic acid, succinic acid, benzene dicarboxylic acid, tetrahydrobenzene dicarboxylic acid, hexahydrobenzene dicarboxylic acid, methyltetrahydrobenzene dicarboxylic acid, and methylhexahydrobenzene dicarboxylic acid, methyl endo-methylene tetrahydro phthalic acid, chlorendic acid, or glutaric acid; tricarboxylic acid and anhydride thereof such as 1,2,4-trimellitic acid; tetracarboxylic acid and anhydride thereof such as 1,2,4,5-pyromellitic acid, benzophenone tetracarboxylic acid, biphenyl tetracarboxylic acid, or biphenylether tetracarboxylic acid.

Preferably, the second alkali-soluble resin (A-2) is the product of V259ME or V301ME manufactured by Shin Nittetsu Chemical.

In one embodiment of the invention, the amount of the second alkali-soluble resin (A-2) used is from 0 to 70 parts by weight; preferably from 5 to 65 parts by weight; more preferably from 10 to 60 parts by weight based on 100 parts by weight of the alkali-soluble resin (A) used. The range makes the photosensitive resin composition has little color difference before and after development.

The compound having an ethylenically unsaturated group (B) according to the invention comprises a cyclic imide compound (B-1) represented by Formula (1);

Formula (1)

wherein in Formula (1), $R^1$ and $R^2$ are independently selected from the group consisting of a hydrogen atom and an alkyl group having 1 to 10 carbon atoms; or $R^1$ and $R^2$ together form a carbon ring.

The structure of the cyclic imide compound (B-1) is a cyclic imide containing a double bond, and one end of the double bond bound to an alkyl group. Preferably, $R^1$ and $R^2$ together form a carbon ring or $R^1$ and $R^2$ are independently an alkyl group having 1 to 4 carbon atoms. Furthermore, the carbon ring formed by $R^1$ and $R^2$ is preferably $CH_2CH_2CH_2$— or $CH_2CH_2CH_2CH_2$—. For example, the cyclic imide compound (B-1) preferably represented by Formula (7) or (8), Formula (7)

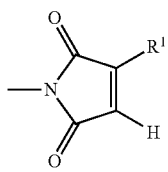

Formula (8)

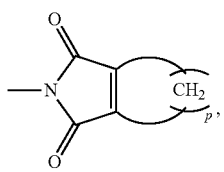

In Formula (8), p is preferably 5 or 6.

The cyclic imide compound (B-1) represented by Formula (1) according to the invention can be different compounds. In one preferred embodiment of the invention, the cyclic imide compound (B-1) represented by Formula (1) is represented by Formula (9), (10), or (11);

Formula (9)

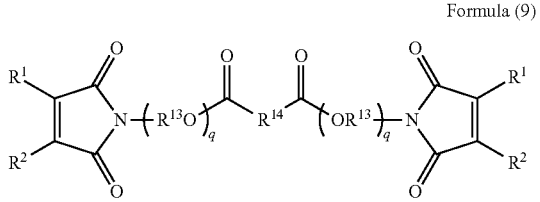

wherein in Formula (9), $R^1$ and $R^2$ are as defined as Formula (1);
$R^{13}$ represents an alkylene group having 1 to 6 carbon atoms;
$R^{14}$ represents a residue obtained by removing an acid group or an oxy dicarbonyl group from a polyvalent carboxylic acid or anhydride thereof; and
q represents an integer of 1 to 6;

Formula (10)

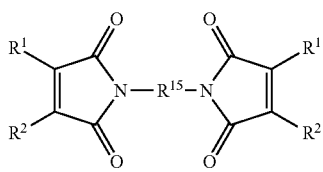

wherein in Formula (10), $R^1$ and $R^2$ are as defined as Formula (1);
$R^{15}$ represents a residue obtained by removing an amino group from a diamine group;

wherein in Formula (11), $R^1$ and $R^2$ are as defined as Formula (1);
$R^{16}$ represents an alkylene group having 1 to 6 carbon atoms;
$R^{17}$ represents a residue obtained by removing an isocyanate group from a diisocyanate group; and
$R^{18}$ represents a residue obtained by removing a hydroxyl group from a diol.

In the cyclic imide compound (B-1) represented by Formula (9), the alkylene group of $R^{13}$ can be linear or branched, and preferably is an ethylene group or a propylene group.

$R^{14}$ represents a residue obtained by removing an acid group or an oxy dicarbonyl group from a polyvalent carboxylic acid or anhydride thereof, and wherein the polyvalent carboxylic acid or anhydride thereof is preferably a divalent carboxylic acid or anhydride thereof. The divalent carboxylic acid or anhydride thereof is such as aliphatic dicarboxylic acid or anhydride thereof, cyclic aliphatic dicarboxylic acid or anhydride thereof or aromatic dicarboxylic acid or anhydride thereof.

Specific examples of aliphatic dicarboxylic acid or anhydride thereof are saturated aliphatic dicarboxylic acid (anhydride) such as malonic acid (anhydride), succinic acid (anhydride), methylsuccinic acid (anhydride), glutaric acid (anhydride), 3-methylglutaric acid (anhydride), sebacic acid and 1,10-dodecandioic acid (anhydride); and unsaturated aliphatic dicarboxylic acid (anhydride) such as maleic acid (anhydride), itaconic acid (anhydride) and citraconic acid (anhydride). Aliphatic dicarboxylic acid or anhydride thereof may also contain an oxygen atom, a nitrogen atom or a sulfur atom. Specific examples of aliphatic dicarboxylic acid or anhydride thereof containing an oxygen atom are diglycolic acid (anhydride) or 3-oxoadipic acid (anhydride); specific examples of aliphatic dicarboxylic acid or anhydride thereof containing a nitrogen atom are iminodiacetic acid (anhydride); and specific examples of aliphatic dicarboxylic acid or anhydride thereof containing a sulfur atom are 3,3'-thiodipropanoic acid (anhydride). Specific examples of cyclic aliphatic dicarboxylic acid or anhydride thereof are hexahydrobenzene dicarboxylic acid (anhydride). Specific examples of aromatic dicarboxylic acid or anhydride thereof are phthalic acid (anhydride), terephthalamic acid, isophthalic acid, 1,4-naphthalene dicarboxylic acid, 2,6-dicarboxylic acid pyrazine or 2,3-naphthalene dicarboxylic acid.

Specific examples of tetracarboxylic anhydride are 3,3',4,4'-benzophenonetetraformic dianhydride or ethylenediamine tetraacetic anhydride.

In one preferred embodiment of the invention, le represents an alkylene group having 4 to 20 carbon atoms.

In the cyclic imide compound (B-1) represented by Formula (10), $R^{15}$ represents a residue obtained by removing an amino group from a diamine group. Examples of the diamine group are aliphatic diamine or aromatic diamine Specific examples of aliphatic diamine are ethylenediamine, 1,3-propylenediamine or 1,6-hexamethylenediamine. The aliphatic diamine may also contain an oxygen atom, a nitrogen atom or Formula (11)

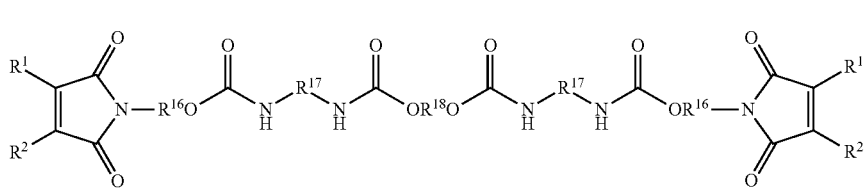

a sulfur atom. Specific example of aliphatic diamine containing an oxygen atom is 4,9-dioxa-1,12-dodecylene diamine; a specific example of aliphatic diamine containing a nitrogen atom is N-(2-aminoethyl)-1,3-propylenediamine or N-(3-aminopropyl)-1,3-propylenediamine; and a specific example of aliphatic diamine containing a sulfur atom is 2-methyl-3-aminohiourea.

Specific examples of aromatic diamine are 1,1-phthylylene-2,2-diamine, 1,2-phenylenediamine, 4,5-dimethyl-1,2-phenylenediamine, 2,3-diaminopyridine or -2,4-diaminopyridine.

In one preferred embodiment of the invention, $R^{15}$ represents an alkylene group having 2 to 20 carbon atoms.

In the cyclic imide compound (B-1) represented by Formula (11), the alkylene group of $R^{16}$ can be linear or branched, and preferably is an ethylene group or a propylene group.

$R^{17}$ represents a residue obtained by removing an isocyanate group from a diisocyanate group, and the diisocyanate group is preferably tolyl diisocyanate, 1,6-hexane diisocyanate, 4,4'-diphenylhexane diisocyanate, polymethylenepolyphenyl isocyanate, hydrotoluene diisocyanate, hydro-4,4'-diphenylmethane diisocyanate, xylene diisocyanate, hydroxylene diisocyanate, p-phenyldiisocyanate, 1,5-naphthalene diisocyanate, 4,4'-dicyclohexylmethane diisocyanate or isophorone diisocyanate.

$R^{18}$ represents a residue obtained by removing a hydroxyl group from a diol, and the diol preferably is low-molecule diol, polyester polyol or polyethylene glycol. Specific examples of low-molecule diol are ethylene glycol, propylene glycol, cyclohexanedimethanol or 3-methyl-1,5-pentylene diol; specific examples of polyether polyol are polyethylene glycol, polypropylene glycol and/or polyalkylidene glycol such as polytetramethylene glycol or block or random diol polymer of polyethylene or polypropoxy; and polyester polyol is obtained through an esterification reaction of polyether polyol and/or low-molecule polyol with an acid part of dicarboxylic acid or anhydride thereof such as adipic acid, succinic acid, phthalic acid, tetrahydrophthalic acid, hexahydrobenzene dicarboxylic acid or benzene dicarboxylic acid.

In a specific example of the present invention, a method for synthesizing the cyclic imide compound (B-1) can be as described in Synthetic Organic Chemistry Society, 30 (10), 897, (1972); Javier de Abajos, Polymer, vol 33 (5), (1992); Japanese Patent Publication No. 1981-53119; Japanese Patent Publication No. 1988-242569. Briefly, the method includes reacting maleic anhydride with substitutents, polyvalent carboxylic acid or the anhydride thereof and amino alcohols.

In a specific example of the present invention, a method for synthesizing the cyclic imide compound (B-1) having the structure represented by Formula (9) includes subjecting maleic anhydride and amino alcohol to an additional cyclization reaction; and then, subjecting the alcohol compound containing a cyclic imido functional group obtained through the reaction and polyvalent carboxylic acid or anhydride thereof to an esterification reaction.

The maleic acid used in the present invention has a structure containing at least one double bond and one end of the double bond is bound to an alkyl group, and specific examples of maleic acid are 3,4,5,6-tetrahydrophthalic anhydride and derivatives thereof, citraconic anhydride and derivatives thereof or dialkylmaleic anhydride and derivatives thereof, among which 3,4,5,6-tetrahydrophthalic anhydride and derivatives thereof are preferred, because of high yield. Specific examples of amino alcohol are alcohol amine such as 2-aminoethanol, 1-amino-2-propanol, 3-amino-1-propanol or 1-aminobutanol, or 2,2'-aminoethoxyethanol. Specific examples of polyvalent carboxylic acid (anhydride) are described above, among which aliphatic dicarboxylic acid (anhydride) and cyclic aliphatic dicarboxylic acid (anhydride) can be used to synthesize imide easily.

In a specific example of the present invention, a method for synthesizing the cyclic imide compound (B-1) having the structure represented by Formula (10) includes subjecting maleic anhydride and diamine to an addition reaction, in which specific examples of maleic anhydride and diamine are as described above.

In a specific example of the present invention, a method for synthesizing the cyclic imide compound (B-1) having the structure represented by Formula (11) includes: first, reacting a diol compound and diisocyanate, to obtain a compound having two isocyanate groups; and then, reacting the compound having two isocyanate groups and the alcohol compound having a cyclic imido functional group, in which specific examples of the diol compound and diisocyanate are as described above.

In addition, products of the esterification reaction of the carboxylic acid having a cyclic imido group synthesized through additional cyclization of maleic anhydride and primary amino carboxylic acid with a diol compound may also be enumerated.

Because the anhydride synthesized from the imide compound according to the present invention has a structure containing at least one double bond and one end of the double bond is bound to an alkyl group, the anhydride can be easily cyclized by adding dimine or amine alcohol to the anhydride, thereby obtaining the imide compound with an excellent yield.

In one embodiment of the invention, the amount of the cyclic imide compound (B-1) represented by Formula (1) used is from 10 to 200 parts by weight; preferably 20 to 180 parts by weight; more preferably 30 to 150 parts by weight based on 100 parts by weight of the alkali-soluble resin (A) used. If the cyclic imide compound (B-1) represented by Formula (1) lacks, it has the defect of bubble display.

Preferably, without affecting the physical properties, the photosensitive resin composition further comprises a compound having an ethylenically unsaturated group (B-2) except the cyclic imide compound (B-1) as mentioned above if necessary. The compound having an ethylenically unsaturated group (B-2) comprises a compound having at least one ethylenically unsaturated group and a compound having two or more than two ethylenically unsaturated groups.

Examples of the compound having one ethylenically unsaturated group include, but are not limited to, acrylamide, (meth)acryloylmorpholine, 7-amino-3,7-dimethyloctyl (meth)acrylate, iso-butoxymethyl(meth)acrylamide, iso-bornyloxyethyl(meth)acrylate, iso-bornyl(meth)acrylate, 2-ethylhexyl(meth)acrylate, ethyl diethylene glycol(meth)acrylate, t-octyl(meth)acrylamide, diacetone(meth)acrylamide, dimethylaminoethyl(meth)acrylate, dodecyl (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxy ethyl(meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth) acrylate, 2-hydroxyethyl(meth)acrylate, 2-hydroxypropyl (meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate, or the like.

Examples of the compound having two or more ethylenically unsaturated groups include, but are not limited to, ethylene glycol di(meth)acrylate, dicyclopentenyl di(meth)acrylate, triethylene glycol diacrylate, tetraethylene glycol di(meth)acrylate, tri(2-hydroxyethyl) isocyanate di(meth)acrylate, tri(2-hydroxyethyl) isocyanate tri(meth)acrylate, caprolactone-modified tri(2-hydroxyethyl) isocyanate tri(meth)acrylate, trimethylolpropyl tri(meth)acrylate, ethylene oxide (hereinafter abbreviated as EO) modified trimethylolpropyl tri(meth)acrylate, propylene oxide (hereinafter abbreviated as PO) modified trimethylolpropyl tri(meth)acrylate, tripropylene glycol di(meth)acrylate, neo-pentyl glycol di(meth)acrylate, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol triacrylate, EO-modified bisphenol F di(meth)acrylate, phenol novolac polyglycidyl ether(meth)acrylate, or the like.

Preferably, the compound having an ethylenic group (B-2) is selected from trimethylolpropyl triacrylate, EO-modified trimethylolpropyl triacrylate, PO-modified trimethylolpropyl triacrylate, pentaerythritol triacrylate, pentaerythritol tetracrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, and PO-modified glycerol triacrylate. The aforesaid examples of the compound having an ethylenic group can be used alone or in admixture of two or more thereof.

In one embodiment of the invention, the amount of the compound having an ethylenically unsaturated group (B) used is from 10 to 500 parts by weight; preferably the amount of the compound having an ethylenically unsaturated group (B) used is from 30 to 450 parts by weight; more preferably the amount of the compound having an ethylenically unsaturated group (B) used is from 50 to 400 parts by weight; based on 100 parts by weight of the alkali-soluble resin (A) used.

The photoinitiator (C) suitable for the present invention is selected from O-acyloxime compounds, triazine compounds, acetophenone compounds, biimidazole compounds, or benzophenone compounds. In one embodiment of the invention, the amount of the photoinitiator (C) used is from 1 to 100 parts by weight; preferably the amount of the photoinitiator (C) used is from 2 to 50 parts by weight; more preferably the amount of the photoinitiator (C) used is from 3 to 30 parts by weight; based on 100 parts by weight of the alkali-soluble resin (A) used.

Examples of the O-acyloxime compounds include, but are not limited to, 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazol-3-yl]-ethylketo 1-(O-acetyloxime), 1-[9-ethyl-6-(3-methylbenzoyl)-9H-carbazol-3-yl]-ethylketo 1-(O-acetyloxime), 1-[9-ethyl-6-benzoyl-9H-carbazol-3-yl]-ethylketo 1-(O-acetyloxime), ethylketo-1-[9-ethyl-6-(2-methyl-4-tetrahydrofurylbenzoyl)-9H-carbazol-3-yl]-1-(O-acetyloxime), ethylketo-1-[9-ethyl-6-(2-methyl-4-tetrapyranylbenzoyl)-9H-carbazol-3-yl]-1-(O-acetyloxime), ethylketo-1-[9-ethyl-6-(2-methyl-5-tetrafurylbenzoyl)-9H-carbazol-3-yl]-1-(O-acetyloxime), ethylketo-1-[9-ethyl-6-(2-methyl-5-tetrapyranylbenzoyl)-9H-carbazol-3-yl]-1-(O-acetyloxime), ethylketo-1-[9-ethyl-6-(2-methyl-4-tetrafurylmethoxybenzoyl)-9H-carbazol-3-yl]-1-(O-acetyloxime), ethylketo-1-[9-ethyl-6-(2-methyl-4-tetrapyranylmethoxybenzoyl)-9H-carbazol-3-yl]-1-(O-acetyloxime), ethylketo-1-[9-ethyl-6-(2-methyl-5-tetrafurylmethoxybenzoyl)-9H-carbazol-3-yl]-1-(O-acetyloxime), ethylketo-1-[9-ethyl-6-(2-methyl-5-tetrapyranylmethoxybenzoyl)-9H-carbazol-3-yl]-1-(O-acetyloxime), ethylketo-1-[9-ethyl-6-{2-methyl-4-(2,2-dimethyl-1,3-dioxolyl)benzoyl}-9H-carbazol-3-yl]-1-(O-acetyloxime), ethylketo-1-[9-ethyl-6-{2-methyl-4-(2,2-dimethyl-1,3-dioxolyl)methoxybenzoyl}-9H-carbazol-3-yl]-1-(O-acetyloxime), or the like.

Examples of the triazine compounds include, but are not limited to, 2,4-bis(trichloromethyl)-6-(p-methoxy)styryl-s-triazine, 2,4-bis(trichloromethyl)-6-(1-p-dimethylaminophenyl-1,3-butadienyl)-s-triazine, 2-trichloromethyl-4-amino-6-(p-methoxy)styryl-s-triazine, or the like.

Examples of the acetophenone compounds include, but are not limited to, p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, 2-benzyl-2-N,N-dimethyl amino-1-(4-morpholinophenyl)-1-butanone, or the like.

Examples of the biimidazole compounds include, but are not limited to, 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenylbiimidazole, 2,2'-bis(2,4-dichlorophenyl)-4,4',5,5'-tetraphenylbiimidazole, or the like.

Examples of the benzophenone compounds include, but are not limited to, thioxanthone, 2,4-diethylthioxanthone, thioxanthone-4-sulfone, benzophenone, 4,4'-bis(dimethylamino)benzophenone, 4,4'-bis(diethylamino)benzophenone, or the like.

Preferably, the photoinitiator (C) is selected from 1-[4-(phenylthio)phenyl]-octane-1,2-dione 2-(O-benzoyloxime), 1-[9-ethyl-6-(2-methylbenzoyl)-9H-carbazol-3-yl]-ethylketo 1-(O-acetyloxime), ethylketo-1-[9-ethyl-6-(2-methyl-4-tetrahydrofurylmethoxybenzoyl)-9H-carbazol-3-yl]-1-(O-acetyloxime), ethylketo-1-[9-ethyl-6-{2-methyl-4-(2,2-dimethyl-1,3-dioxolyl)methoxybenzo yl}-9H-carbazol-3-yl]-1-(O-acetyloxime), 2,4-bis(trichloromethyl)-6-(p-methoxy)styryl-s-triazine, 2-benzyl-2-N,N-dimethylamino-1-(4-morpholinophenyl)-1-butanone, 2,2'-bis(2,4-dichlorophenyl)-4,4',5,5'-tetraphenylbiimidazole, and 4,4'-bis(diethylamino)benzophenone.

In addition to the aforesaid photoinitiators, other initiators can be further added into the photosensitive resin composition of the present invention. Examples of the other initiators include, but are not limited to, α-diketone compounds, acyloin compounds, acyloin ether compounds, acylphosphine oxide compounds, quinone compounds, halide compounds, and peroxide compounds.

Examples of the α-diketone compounds are benzil, acetyl, or the like. Examples of the acyloin compounds are benzoin, or the like. Examples of the acyloin ether compounds are benzoin methyl ether, benzoin ethyl ether, benzoin isopropyl ether, or the like. Examples of the acylphosphine oxide compounds are 2,4,6-trimethylbenzoyl diphenylphosphine oxide, bis-(2,6-dimethoxybenzoyl)-2,4,4-trimethyl benzyl phosphine oxide, or the like. Examples of the quinone compounds are anthraquinone, 1,4-naphthoquinone, or the like. Examples of the halide compounds are phenacyl chloride, tribromomethyl phenylsulfone, tris(trichloromethyl)-s-triazine, or the like. Examples of the peroxide compounds are di-tert-butyl peroxide; or the like. The photoinitiator can be used alone or in admixture of two or more thereof.

The organic solvent (D) according to the invention has the ability to dissolve the alkali-soluble resin (A), the compound having an ethylenically unsaturated group (B) and the photoinitiator (C) without reacting with these components and has proper volatility.

Examples of the organic solvent (D) include, but are not limited to, (poly)alkylene glycol monoalkyl ethers, such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol methyl ether, dipropylene glycol ethyl ether, dipropylene glycol n-propyl ether, dipropylene glycol n-butyl ether, tripropylene glycol methyl ether, tripropylene glycol ethyl ether, or the like; (poly)alkylene glycol monoalkyl ether acetates, such as ethylene glycol methyl ether acetate, ethylene glycol ethyl ether acetate, propylene glycol methyl ether acetate, propylene glycol ethyl ether acetate, or the like; other ethers, such as diethylene glycol dimethyl ether, diethylene glycol methyl ethyl ether, diethylene glycol diethyl ether, tetrahydrofuran, or the like; ketones, such as methyl ethyl ketone, cyclohexanone, 2-heptanone, 3-heptanone, or the like; alkyl lactate, such as methyl 2-hydroxypropionate, ethyl 2-hydroxypropionate, or the like; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methyl-3-methoxybutyl acetate, 3-methyl-3-methoxybutyl propionate, ethyl acetate, n-propyl acetate, iso-propyl acetate, n-butyl acetate, isobutyl acetate, n-amyl acetate, iso-amyl acetate, n-butyl propionate, ethyl butyrate, n-propyl butyrate, iso-propyl butyrate, n-butyl butyrate, methyl pyruvate, ethyl pyruvate, n-propyl pyruvate, methyl acetoacetate, ethyl acetoacetate, ethyl 2-oxobutyrate, or the like; aromatic hydrocarbons, such as toluene, xylene, or the like; and carboxylic acid amide, such as N-methyl-2-pyrrolidone, N,N-dimethylformamide, N,N-dimethylacetamide, or the like. Preferably, the solvent is selected from propylene glycol methyl ether acetate and ethyl 3-ethoxypropionate. The aforesaid examples of the solvent can be used alone or in admixture of two or more thereof.

In one embodiment of the invention, the amount of the organic solvent (D) used is from 50 to 5000 parts by weight; preferably from 250 to 4000 parts by weight; more preferably from 500 to 3000 parts by weight; based on 100 parts by weight of the alkali-soluble resin (A) used.

The pigment (E) according to the present invention may be an inorganic pigment, organic pigments, or a combination thereof. The inorganic pigment is a metal compound such as a metal oxide or a metal complex salt; for example, an oxide of iron, cobalt, aluminum, cadmium, lead, copper, titanium, magnesium, chromium, zinc, antimony, or the like or a complex salt thereof.

Examples of the organic pigment are C. I. Pigment Yellow 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175; C. I. Pigment Orange 1, 5, 13, 14, 16, 17, 24, 34, 36, 38, 40, 43, 46, 49, 51, 61, 63, 64, 71, 73; C. I. Pigment Red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 193, 194, 202, 206, 207, 208, 209, 215, 216, 220, 224, 226, 242, 243, 245, 254, 255, 264, 265; C. I. Pigment Violet 1, 19, 23, 29, 32, 36, 38, 39; C. I. Pigment Blue 1, 2, 15, 15:3, 15:4, 15:6, 16, 22, 60, 66; C. I. Pigment Green 7, 36, 37; C. I. Pigment Brown 23, 25, 28; C. I. Pigment Black 1, 7.

The aforesaid examples of the pigment (E) can be used alone or in admixture of two or more thereof. The amount of the pigment (E) used is from 10 to 500 parts by weight based on 100 parts by weight of the alkali-soluble resin (A) used; preferably, from 50 to 400 parts by weight; more preferably, from 100 to 300 parts by weight.

The average particle diameter of the pigment (E) in the photosensitive resin composition for a color filter according to the invention is generally from 10 nm to 200 nm, preferably from 20 nm to 150 nm, more preferably from 30 nm to 130 nm.

As needed, the pigment (E) is accompanied by using a dispersing agent, such as a cationic, anionic, nonionic, amphoteric, fluorine-based or silicone-based surfactant.

Examples of the surfactant are polyoxyethylene alkyl ethers, such as polyoxyethylene dodecyl ether, polyoxyethylene stearyl ether and polyoxyethylene oleyl ether; polyoxyethylene phenyl ethers, such as polyoxyethylene n-octyl phenyl ether and polyoxyethylene n-nonylphenyl ether; polyoxyethylene dialkyl esters, such as polyoxyethylene dilaurate and polyoxyethylene distearate; sorbitol anhydride fatty acid esters; fatty acid modified polyesters; tertiary amine modified poly-amino acid esters; KP products of Shin-Etsu Chemical Industries, Ltd., SF-8427 manufactured by Toray Dow Corning Silicon, Polyflow products manufactured by Kyoeisha Yushi Kagaku Kogyo, F-Top product manufactured by Tochem Products Co., Ltd., Megafac products manufactured by Japanese ink chemical industry, Fluorade manufactured by Sumitomo 3M, Asahi Guard manufactured by Asahi Glass Company, Surflon manufactured by Asahi Glass Company.

Preferably, the photosensitive resin composition according to the present invention can contain additives (F) according to the specific requirements for the physical and/or chemical properties. The additives can be chosen by skilled artisans in the field. Examples of the additives are a compound (F-1) having two or more thiol groups in one molecule and other additives (F-2).

The compound (F-1) having two or more thiol groups in one molecule comprises a divergence configuration with respect to the thiol group of the α-position and/or β-position. Examples include but are not limited to 2,5-hexanedithiol, 2,9-decanedithiol, ethylene glycol bis(3-mercapto butyrate), butanediol bis(3-mercapto butyrate), octanediol bis(3-mercapto butyrate), trimethylolpropane tris(3-mercapto butyrate), pentaerythritol tetrakis(3-mercapto butyrate), ethylene glycol bis(2-mercaptopropionate), butanediol bis(2-mercaptopropionate), octanediol bis(2-mercaptopropionate), trimethylolpropane tris(2-mercaptopropionate), pentaerythritol tetrakis(2-mercaptopropionate), ethylene glycol bis(2-mercaptoisobutyrate), butanediol bis(2-mercaptoisobutyrate), octanediol bis(2-mercaptoisobutyrate), trimethylolpropane tris(2-mercaptoisobutyrate), pentaerythritol tetrakis(2-mercaptoisobutyrate), ethylene glycol bis(3-mercaptovalerate), butanediol bis(3-mercapto valerate), octanediol bis(3-mercapto valerate), trimethylolpropanetris (3-mercapto valerate), pentaerythritol tetrakis(3-mercapto valerate), 1,4-bis(1-mercaptoethyl)benzene, (2-mercaptoethyl)benzene, phthalic acid bis(2-mercaptoethyl ester), phthalic acid bis(2-mercaptopropanyl ester), phthalic acid bis(2-mercaptobutanyl ester) or the like.

Preferably, the compound (F-1) having two or more thiol groups in one molecule is ethylene glycol bis(3-mercapto butyrate), butanediol bis(3-mercapto butyrate), octanediol bis(3-mercapto butyrate), trimethylolpropane tris(3-mercapto butyrate), pentaerythritol tetrakis(3-mercapto butyrate), ethylene glycol bis(2-mercaptoisobutyrate), butanediol bis(2-mercaptoisobutyrate), octanediol bis(2-mercaptoisobutyrate), trimethylolpropane tris(2-mercaptoisobutyrate), or pentaerythritol tetrakis(2-mercaptoisobutyrate); more preferably, ethylene glycol bis(3-mercapto butyrate) or butanediol bis(3-mercapto butyrate), and the polymerization initiation and the storage are better. The aforesaid examples of the compound (F-1) having two or more thiol groups in one molecule can be used alone or in admixture of two or more thereof.

Generally, the amount of the compound (F-1) having two or more thiol groups in one molecule used is from 1 to 100 parts by weight based on 100 parts by weight of the alkali-soluble resin (A) used, and the adhesion of subsequent formation of a pattern is good.

In another aspect, the other additives (F-2) further comprises surfactants, fillers, polymers other than the alkali-soluble resin (A), adhesion agents, antioxidants, UV absorbents, anti-coagulants, or the like.

Examples of the aforementioned surfactants are the same to the surfactants used accompanied with the pigment (E), and are not repeated again. The aforesaid examples of the surfactants can be used alone or in admixture of two or more thereof. The amount of the surfactants used is from 0 to 6 parts by weight; preferably from 0 to 4 parts by weight; more preferably from 0 to 3 parts by weight based on 100 parts by weight of the alkali-soluble resin (A) used, and the coating of the photosensitive composition for a color filter is improved.

In the preferred embodiment of the invention, the fillers include glass, alumina, or the like. Examples of the polymers other than the alkali-soluble resin (A) include polyvinyl alcohol, polyethylene glycol monoalkyl ether, polyfluoro alkyl acrylate, or the like. Examples of the adhesion agents include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryl oxypropyltrimethoxysilane, 3-mercaptopropyltrimethoxysilane, or the like. Examples of the antioxidants include 2,2-thiobis(4-methyl-6-t-butylphenol), 2,6-di-t-butylphenol, or the like. Examples of the UV absorbents include 2-(3-t-butyl-5-methyl-2-hydroxyphenyl)-5-chlorobenzotriazole, alkoxybenzophenone, or the like. Examples of the anti-coagulants include sodium polyacrylate, or the like.

Preferably, The other additives (F-2) are used in an amount ranging generally from 0 to 10 parts by weight, preferably from 0 to 6 parts by weight, and more preferably from 0 to 3 parts by weight, based on 100 parts by weight of the alkali-soluble resin (A).

The present invention also provides a method for manufacturing a color filter comprising forming a pattern with the photosensitive resin composition as mentioned above.

In one embodiment of the invention, the photosensitive resin composition in a liquid state for the color filter in the present invention can be formed by blending the alkali-soluble resin (A), the compound having an ethylenically unsaturated group (B), the photoinitiator (C), and the pigment (E) in the organic solvent (D) using a mixer, and the compound (F-1) having two or more thiol groups in one molecule and other additives (F-2) comprising surfactants, fillers, polymers other than the alkali-soluble resin (A), adhesion agents, antioxidants, UV absorbents, anti-coagulants, or the like are mixed if needed.

The manner for manufacturing the photosensitive resin composition for a color filter according to the invention can be carried out by skilled artisans in the field. For example, the pigment (E) can be added directly to the photosensitive resin composition for a color filter and dispersed, or a part of the pigment (E) is dispersed in a part of the alkali-soluble resin (A) and the organic solvent (D) first, to obtain a dispersion. Then, the compound having an ethylenically unsaturated group (B), the photoinitiator (C), and the remaining parts of the pigment (E), the alkali-soluble resin (A) and the organic solvent (D) are then mixed. The dispersing step of the pigment (E) can be carried out by mixing the above ingredients with a mixer such as a beads mill or a roll mill.

The present invention also provides a color filter manufactured by the method as mentioned above.

The manner for manufacturing the color filter by applying the photosensitive resin composition according to the invention can be coated on a substrate by a spin coating method, a cast coating method, a roller coating method, or the like. The substrate used to form the color filter is made from bare glass, soda glass, Pyrex glass, silica glass, or any one of these glass coated with a transparent conductive film, or a transparent electrode substrate (such as a Si substrate) used in solid state image pick up devices. Before coating the photosensitive resin composition on the substrate, a black matrix is formed on the substrate to separate each color pixel element.

After coating, the photosensitive resin composition is then dried under reduced pressure to remove most of the solvent. After completely evaporating the residual solvent by pre-baking, a coating film is formed. Operation conditions for the drying under reduced pressure and the pre-baking depend on kinds and amounts of the components used in the photosensitive resin composition. In general, the drying under reduced pressure is carried out at a pressure from 0 to 200 mm Hg for a period from 1 to 60 seconds. The pre-baking is carried out at a temperature from 70° C. to 110° C. for a period from 1 to 15 minutes.

The coating film is then exposed to UV light through a specific photo mask, The UV light used for the exposure of the coating film can be g line, h line, i line, or the like. Preferably, the UV light used for the exposure of the coating film can be g line, h line, i line, or the like. The UV lamp for providing the UV light is a (ultra)high-pressure mercury lamp or a metal halide lamp.

After exposure, the coating film is developed in a developer solution at a temperature of 23±2° C. for a period from 15 seconds to 5 minutes to dissolve and remove the unexposed portions of the coating film so as to obtain a desired pattern. In one preferred embodiment of the invention, the developer solution is preferably an alkali aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diaza-bicyclo(5,4,0)-7-undecene, or the like. The concentration of the developer in the solution is from 0.001 wt % to 10 wt %, preferably from 0.005 wt % to 5 wt %, and more preferably from 0.01 wt % to 1 wt %.

The substrate with the desired pattern of the coating film is washed with water, is dried with compressed air or compressed nitrogen, and is heated at a temperature from 100 to 280° C. for a period of 1 to 15 minutes to remove undesired components to obtain the pattern.

The colored pixel layer (mainly comprising red, green and blue colors) can be obtained, similarly.

Furthermore, an indium tin oxide (ITO) vapor deposition film is formed on the pixel layer under a vacuum environment of a temperature of 220° C. to 250° C. When necessary, the ITO film is further coated with polyimideimine for liquid crystal alignment membrane after etching and wiring, thereby firing, a color filter for a liquid crystal display device is obtained.

The present invention further provides a liquid crystal display device comprising the color filter as mentioned above.

According to the liquid crystal display device, a color filter substrate obtained as mentioned above and a driver substrate with a thin film transistor (TFT) substrate are disposed oppositely, and cell gap is disposed therebetween, and the two substrates are sealed with a sealing agent around the sites of the two substrates. Liquid crystals are then injected into the space defined by the surfaces of the substrates and the sealing agent, and the inject hole is further sealed to form liquid crystal cell. Then, a polarizer is adhered on the outer surface of the liquid crystal cell, i.e. on the other side of each substrate constituting the liquid crystal cell, and the liquid crystal display device is obtained.

The above mentioned liquid crystal (liquid crystal compound or liquid crystal composition) is not limited, and any liquid crystal compound or liquid crystal composition can be applied.

In addition, the above mentioned liquid crystal alignment membrane for aligning the direction of the liquid crystal is not limited, and an organic compound or an inorganic compound can be applied. The manner for forming the alignment membrane is known to artisans skilled in this field, and not the technical feature of the invention, and not illustrated herein.

The following examples are given for the purpose of illustration only and are not intended to limit the scope of the present invention.

Example

Preparations of First Alkali-Soluble Resins (A-1-1) to (A-1-9)

A 1000 ml four-necked flask equipped with a nitrogen inlet, a stirrer, a heater, a condenser and a thermometer was added with the feed composition according to the ratio shown in Table 1 with nitrogen introduced. The feed composition comprises a first unsaturated monomer, a second unsaturated monomer, a third unsaturated monomer, a initiator for polymerization and a solvent.

In the polymerization, the first unsaturated monomer, the second unsaturated monomer, the third unsaturated monomer are fed continuously into the flask and then stirred in an oil bath at a temperature of 100° C., and the initiator is fed by five equal amount in one hour interval into the flask. The reaction temperature is maintained at 100° C. in the polymerization process, and the polymerization time is 6.0 hours. After the completion of the polymerization, the polymerization product was taken out from the four-necked flask and the solvent was devolatilized to obtain the first alkali-soluble resin.

TABLE 1

Preparations of First Alkali-soluble Resins (A-1-1) to (A-1-9)

| | Components (parts by weight) | | | | | | | | | | | | | |
|---|---|---|---|---|---|---|---|---|---|---|---|---|---|---|
| | Monomer for copolymerization | | | | | | | | | | | | initiator | solvent |
| | first unsaturated monomer | | | second unsaturated monomer | | | | third unsaturated monomer | | | | | | |
| Preparations | HOMS | MAA | AA | FA-511A | FA-512A | FA-512M | FA-513M | SM | PMI | GMA | MMA | MA | AMBN | EEP |
| A-1-1 | 20 | | | 50 | | | | 30 | | | | | 6 | 200 |
| A-1-2 | | 35 | | | 45 | | | | 15 | | 5 | | 6 | 200 |
| A-1-3 | | | 50 | | | 10 | | | 5 | | | 35 | 6 | 200 |
| A-1-4 | 20 | 20 | | | | | 30 | | | 5 | | 25 | 6 | 200 |
| A-1-5 | 20 | | | | | 10 | | | | | 70 | | 6 | 200 |
| A-1-6 | | 10 | 10 | 20 | 10 | | | | | 10 | 40 | | 6 | 200 |
| A-1-7 | | 50 | | | | | 50 | | | | | | 6 | 200 |
| A-1-8 | 30 | | | | | | | 50 | 20 | | | | 6 | 200 |
| A-1-9 | | 50 | | | | | | 30 | | | | 20 | 6 | 200 |

Abbreviation Compound
HOMS 2-methacryloyloxyethyl succinate monoester
MAA methacrylic acid
AA acrylic acid
FA-511A dicyclopentenyl acrylate
FA-512A dicyclopentenyloxyethyl acrylate
FA-512M dicyclopentenyloxyethyl methacrylate
FA-513M dicyclopenteny methacrylate
SM styrene monomer
PMI N-phenyl maleimide
GMA Glycidyl methacrylate
MMA methyl methacrylate
MA methacrylate
AMBN 2,2'-azobis-2-methyl butyronitrile
EEP ethyl 3-ethoxypropionate

Preparation of Cyclic Imide Compound (B-1-1)

A flask equipped with a stirrer, a condenser and a thermometer is fed with 65 g of 3,4,5,6-tetrahydrophthalic anhydride, 95 g of toluene, and 0.01 g hydroquinone (hereinafter referred to HQ). The composition is uniformly dissolved at 60° C., and added dropwise with 25 g of ethanolamine within 1 hour. The dehydration reaction is performed for 3 hours at 120° C. to 140° C. The composition is then added with 30 g of adipic acid and 5 g of concentrated sulfuric acid and then cooled to about 80° C. The reaction mixture is further heated to 120° C. to 140° C. for 3 hours and then the reaction is terminated. The resulting reaction mixture is transferred to a separatory funnel, and washed with water, 15% aqueous sodium hydroxide solution and 4% ammonium sulfate solution. The toluene in the washed reaction solution is removed under reduced pressure, and 80 g pale yellow liquid as shown in Formula (12) is obtained.

Preparation of Cyclic Imide Compound (B-1-3)

The reactants of the preparation of the cyclic imide compound (B-1-1) is modified as 60 g of 3,4,5,6-tetrahydrophthalic anhydride, 90 g of toluene, and 0.04 g hydroquinone. The composition is uniformly dissolved at 60° C., and added dropwise with 40 g of 4,9-dioxa-1,12-dodecylene diamine within 1 hour. The dehydration reaction is performed for 3 hours at 120° C. to 140° C. The composition is then added with 30 g of adipic acid and 5 g of concentrated sulfuric acid and then cooled to about 80° C. The reaction mixture is further heated to 120° C. to 140° C. for 3.5 hours and then the reaction is terminated. After the resulting reaction mixture is washed, the organic layer is divided and the toluene is removed under reduced pressure, 90 g hazel liquid as shown in Formula (14) is obtained.

Formula (12)

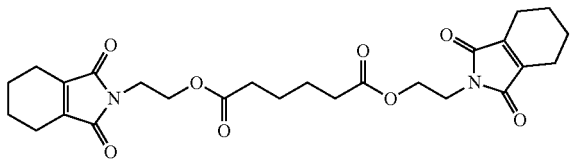

Preparation of Cyclic Imide Compound (B-1-2)

The preparation of cyclic imide compound (B-1-2) is similar to that of the cyclic imide compound (B-1-1) with the modifications of using 80 g of citraconic anhydride instead of 3,4,5,6-tetrahydrophthalic anhydride, 120 g of toluene, and 0.06 g hydroquinone, 40 g of ethanolamine, 50 g of adipic acid and 10 g of concentrated sulfuric acid. Sixty-five g of white solid as shown in Formula (13) is obtained.

Formula (13)

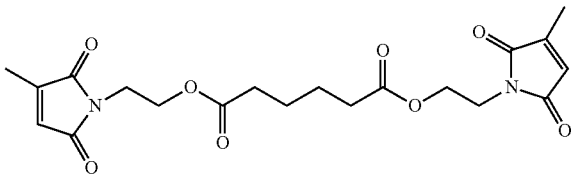

Formula (14)

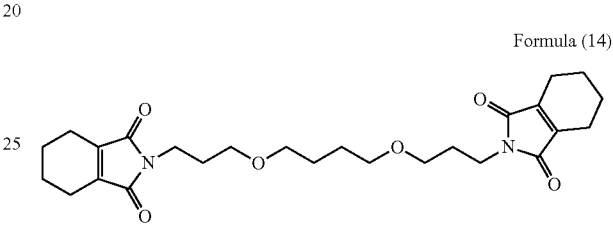

Preparation of Cyclic Imide Compound (B-1-4)

The reactants of the preparation of the cyclic imide compound (B-1-1) is modified as 30 g of 3,4,5,6-tetrahydrophthalic anhydride, 100 g of toluene, 0.01 g hydroquinone, and 12 g of ethanolamine. After the reaction, the reaction mixture is cooled to room temperature, and added with 0.1 g of dibutyltin dilaurate and 45 g of isophorone diisocyanate, and the mixture is stirred at 40° C. for 30 minutes. Furthermore, 20 g of tripropylene glycol is added, and the mixture is stirred at 60° C. for 2 hours. The solvent is removed under reduced pressure, and viscos liquid as shown in Formula (15) is obtained.

Formula (15)

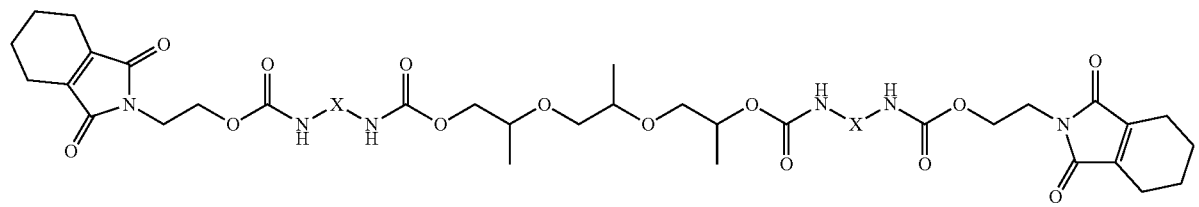

X represents 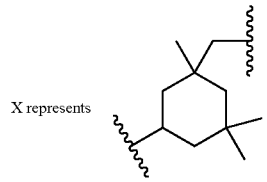

Examples 1 to 8 and Comparative Examples 1 to 5 of Photosensitive Resin Composition The components and amounts of the alkali-soluble resin (comprising the first alkali-soluble resin and the second alkali-soluble resin), the compound having an ethylenically unsaturated group (comprising the cyclic imide compound (B-1) and other compound having an ethylenically unsaturated group (B-2)), the photoinitiator, the organic solvent and the pigment for the preparation of the photosensitive resin composition are prepared according to the formulation in Table 2.

The alkali-soluble resin, the compound having an ethylenically unsaturated group, the photoinitiator, and the pigment are added in the organic solvent and mixed and dissolved using a shaker to obtain the photosensitive resin composition. The photosensitive resin composition is assayed as follows and shown in Table 2.

Assays

1. Defect of Bubble Display

The produced liquid crystal display element is placed at the high temperature of 100° C. and high humidity of 95RH %. The time t is the appearance of the defect of bubble display observed by eyes. The evaluation criteria are as follows:

○: t>500 hr
Δ: 300 hr<t≤500 hr
x: 300 hr

2. Color Difference Before and After Development

The photosensitive resin composition is spin-coated on a glass substrate (100 mm×100 mm), dried under a pressure of 100 mmHg for 30 seconds, and is pre-baked at a temperature of 80° C. for 2 minutes to form a pre-baked film having a thickness of 2.5 nm. The chromaticity (L*, a*, b*) is measured by the chromometer (Otsuka Electronics Co., Ltd., Model MCPD).

The pre-baked film is exposed using a mask aligner (Canon PLA-501F, 100 mJ/cm$^2$), is immersed into a developer solution at a temperature of 23° C. for 1 minutes, is washed with water. The chromaticity is measured again. The color difference of the chromaticity (ΔEab*) is measured as below:

$$\Delta Eab^* = \{(\Delta L)^2 + (\Delta a)^2 + (\Delta b)^2\}^{1/2}$$

○: color difference ΔEab*<2
Δ: 2≤color difference ΔEab*<6
x: 6≤color difference ΔEab*

3. Residues

The pre-baked film as mentioned above is exposed using a mask aligner (Canon PLA-501F, 100 mJ/cm$^2$), is immersed into a developer solution at a temperature of 23° C. for 1 minutes, is washed with water. The composition is then post-baked at a temperature of 235° C. for 30 minutes. A photosensitive resin layer with pattern is obtained thereby. The pattern is observed with the microscope to detect the residues.

○: no residues
Δ: few residues
x: many residues

TABLE 2

Components and Assays of Examples and Comparative Examples of Photosensitive Resin Composition

| | Component | Examples 1 | 2 | 3 | 4 | 5 | 6 | 7 | 8 | Comparative Examples 1 | 2 | 3 | 4 | 5 |
|---|---|---|---|---|---|---|---|---|---|---|---|---|---|---|
| alkali-soluble resin (A) (parts by weight) | A-1-1 | 90 | | | | | | | | | | | | |
| | A-1-2 | | 80 | | | | | | | | | | | |
| | A-1-3 | | | 70 | | | | | | 75 | | | | |
| | A-1-4 | | | | 60 | | | | | | 100 | | | |
| | A-1-5 | | | | | 45 | | | | | | | | |
| | A-1-6 | | | | | | 30 | | 100 | | | | | |
| | A-1-7 | | | | | | | 80 | | | | | | |
| | A-1-8 | | | | | | | | | | | 100 | | |
| | A-1-9 | | | | | | | | | | | | 50 | 90 |
| | A-2-1 | 10 | | 30 | | 55 | 40 | | | | | | 50 | 10 |
| | A-2-2 | | 20 | | 40 | | 30 | 20 | | 25 | | | | |
| compound having an ethylenically unsaturated group (B) (parts by weight) | B-1-1 | 70 | | | | | | | 40 | | | | | |
| | B-1-2 | | 150 | | | | 35 | 40 | | | | | | 50 |
| | B-1-3 | | | 90 | | 10 | | 100 | | | | 100 | | |
| | B-1-4 | | | | 200 | | | | | | | | | |
| | B-2-1 | | | | | 40 | | | | 40 | | | | |
| | B-2-2 | | | | | 50 | | | | | 80 | 45 | | |
| | B-2-3 | | | | | | 45 | | 40 | | | | | 50 |
| photoinitiator (C) (parts by weight) | C-1 | 3 | 3 | 10 | 5 | 8 | 3 | 3 | 8 | 5 | 8 | 3 | 8 | 3 |
| | C-2 | 5 | 5 | | | 8 | 5 | 5 | 8 | | 8 | 5 | 8 | 5 |
| | C-3 | 7 | 5 | 5 | 10 | | 7 | 7 | | 10 | | 7 | | 7 |
| | C-4 | | | | 4 | | | | | | | | | |
| solvent (D) (parts by weight) | D-1 | 1000 | 1500 | | 1000 | 1000 | 1500 | | 1000 | 2000 | 2000 | 2000 | 2000 | |
| | D-2 | 1000 | | 2000 | 1000 | 1000 | | 2500 | | | | | | 2000 |
| pigment (E) (parts by weight) | E-1 | 180 | | | | 180 | | | | 180 | | | | |
| | E-2 | | 190 | | | | 180 | | | | 190 | | | |
| | E-3 | | | 200 | | | | 180 | | | | 200 | | |
| | E-4 | | | | 210 | | | | 200 | | | | 200 | 180 |

TABLE 2-continued

Components and Assays of Examples and Comparative Examples of Photosensitive Resin Composition

| | | Examples | | | | | | | | Comparative Examples | | | | |
|---|---|---|---|---|---|---|---|---|---|---|---|---|---|---|
| | Component | 1 | 2 | 3 | 4 | 5 | 6 | 7 | 8 | 1 | 2 | 3 | 4 | 5 |
| Assays | Color Difference Before and After Development | ○ | ○ | ○ | ○ | ○ | ○ | ○ | Δ | ○ | Δ | ○ | X | ○ |
| | Residues | ○ | ○ | ○ | ○ | ○ | ○ | Δ | ○ | ○ | ○ | ○ | ○ | ○ |
| | Defect of bubble display | ○ | ○ | ○ | ○ | ○ | ○ | ○ | ○ | X | X | X | X | X |

A-2-1 V259ME (manufactured by Shin Nittetsu Chemical.)
A-2-2 V301ME (manufactured by Shin Nittetsu Chemical.)
B-1-1 Compound as shown in Formula (12)
B-1-2 Compound as shown in Formula (13)
B-1-3 Compound as shown in Formula (14)
B-1-4 Compound as shown in Formula (15)
B-2-1 trimethylolpropyl triacrylate
B-2-2 EO-modified trimethylolpropyl triacrylate
B-2-3 dipentaerythritol hexaacrylate
C-1 2-methyl-1-(4-methylthiophenyl)-2-morpholino-1-propanone
C-2 2,2'-bis(2,4-dichlorophenyl)-4,4',5,5'-tetraphenylbiimidazole
C-3 4,4'-bis(diethylamino)benzophenone
C-4 1-[4-(phenylthio)phenyl]-octane-1,2-dione 2-(O-benzoyloxime)
D-1 propylene glycol methyl ether acetate
D-2 ethyl 3-ethoxypropionate
E-1 C.I. Pigment R254/C.I. Pigment Y139 = 80/20
E-2 C.I. Pigment G36/C.I. Pigment Y150 = 60/40
E-3 C.I. Pigment B15:6
E-4 C.I. Pigment BK7

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A method for manufacturing a color filter comprising applying a photosensitive resin composition to form a pixel layer, wherein the photosensitive resin composition comprising:

an alkali-soluble resin (A) comprising a first alkali-soluble resin (A-1) polymerized by a monomer mixture, and the monomer mixture comprising a first unsaturated monomer containing a carboxylic acid group and a second unsaturated monomer containing an alicyclic group, wherein the second unsaturated monomer contains a bicyclopentadienyl group represented by Formula (3), Formula (3)

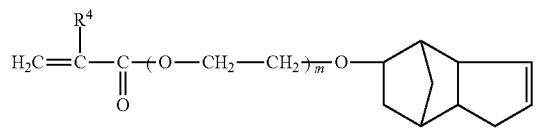

wherein, $R^4$ is a hydrogen atom or a methyl group; and m is an integer of 0 to 2;

the amount of the second unsaturated monomer used is from 15 to 40 parts by weight based on 100 parts by weight of the monomer mixture used;

the alkali-soluble resin (A) further comprising a second alkali-soluble resin (A-2), and the second alkali-soluble resin (A-2) comprises a derived unit represented by Formula (4), Formula (4)

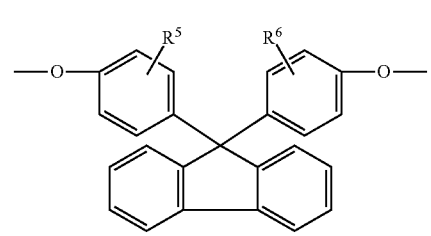

wherein in Formula (4), $R^5$ and $R^6$ are independently selected from the group consisting of a hydrogen atom and a linear or branched alkyl group having 1 to 5 carbon atoms, a phenyl group and a halogen atom;

wherein the amount of the first alkali-soluble resin (A-1) used is from 60 to 90 parts by weight; and the amount of the second alkali-soluble resin (A-2) used is from 10 to 40 parts by weight based on 100 parts by weight of the alkali-soluble resin (A) used;

a compound having an ethylenically unsaturated group (B) comprising a cyclic imide compound (B-1) represented by Formula (1);

Formula (1)

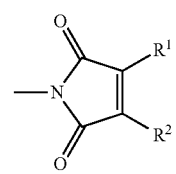

wherein in Formula (1), $R^1$ and $R^2$ are independently selected from the group consisting of a hydrogen atom and an alkyl group having 1 to 10 carbon atoms; or
$R^1$ and $R^2$ together form a carbon ring;
a photoinitiator (C);
a solvent (D); and
a pigment (E).

2. The method according to claim 1, wherein the second unsaturated monomer is selected from the group consisting of bicyclopentenyl(meth)acrylate, bicyclopentenyloxyethyl(meth)acrylate, and the mixture thereof.

3. The method according to claim 1, wherein the monomer mixture further comprises a third unsaturated monomer.

4. The method according to claim 3, wherein the third unsaturated monomer is selected from the group consisting of N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, and N-cyclohexylmaleimide.

5. The method according to claim 4, wherein the amount of the third unsaturated monomer used is from 5 to 15 parts by weight based on 100 parts by weight of the monomer mixture used.

6. The method according to claim 3, wherein the amount of the first unsaturated monomer used is from 20 to 50 parts by weight; and the amount of the third unsaturated monomer used is from 0 to 70 parts by weight based on 100 parts by weight of the monomer mixture used.

7. The method according to claim 1, wherein the cyclic imide compound (B-1) represented by Formula (1) is selected from the group consisting of compounds represented by Formulae (9), (10), and (11);

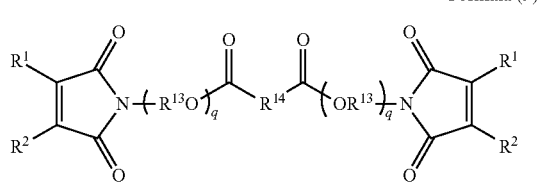

Formula (9)

wherein in Formula (9), $R^{13}$ represents an alkylene group having 1 to 6 carbon atoms;

$R^{14}$ represents a residue obtained by removing an acid group or an oxy dicarbonyl group from a polyvalent carboxylic acid or anhydride thereof; and
q represents an integer of 1 to 6;

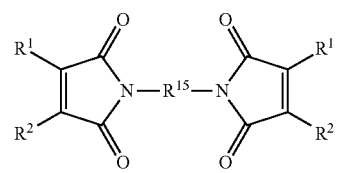

Formula (10)

wherein in Formula (10), $R^{15}$ represents a residue obtained by removing an amino group from a diamine group;

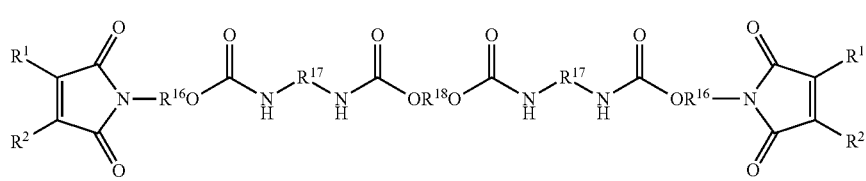

Formula (11)

wherein in Formula (11), $R^{16}$ represents an alkylene group having 1 to 6 carbon atoms;

$R^{17}$ represents a residue obtained by removing an isocyanate group from a diisocyanate group; and
$R^{18}$ represents a residue obtained by removing a hydroxyl group from a diol.

8. The method according to claim 1, wherein the amount of the cyclic imide compound (B-1) represented by Formula (1) used is from 10 to 200 parts by weight based on 100 parts by weight of the alkali-soluble resin (A) used.

9. The method according to claim 1, wherein the amount of the compound having an ethylenically unsaturated group (B) used is from 10 to 500 parts by weight; the amount of the photoinitiator (C) used is from 1 to 100 parts by weight; the amount of the organic solvent (D) used is from 50 to 5000 parts by weight; the amount of the pigment (E) used is from 10 to 500 parts by weight based on 100 parts by weight of the alkali-soluble resin (A) used.

10. A color filter manufactured by the method according to claim 1.

11. A liquid crystal display component comprising the color filter according to claim 10.

* * * * *